United States Patent
Jones et al.

(12) 
(10) Patent No.: US 6,351,099 B2
(45) Date of Patent: Feb. 26, 2002

(54) BATTERY MONITORING SYSTEM WITH INTEGRATED BATTERY HOLDER

(75) Inventors: Brian W. Jones, Richardson; Scott E. Jones, Highland Village, both of TX (US)

(73) Assignee: Dallas Semiconductor Corporation, Dallas, TX (US)

( * ) Notice: Subject to any disclaimer, the term of this patent is extended or adjusted under 35 U.S.C. 154(b) by 0 days.

(21) Appl. No.: 09/773,112

(22) Filed: Jan. 31, 2001

Related U.S. Application Data

(62) Division of application No. 09/359,940, filed on Jul. 22, 1999, now Pat. No. 6,208,114.

(51) Int. Cl.⁷ .............................................. H01M 10/46
(52) U.S. Cl. ................. 320/132; 320/DIG. 12
(58) Field of Search ................... 320/107, 127, 320/132, 137, 161, 162, 164, DIG. 12, DIG. 21

(56) References Cited

U.S. PATENT DOCUMENTS

| | | | |
|---|---|---|---|
| 4,709,202 A | | 11/1987 | Koenck et al. ............... 320/43 |
| 5,262,868 A | * | 11/1993 | Kaneko et al. |
| 5,365,221 A | | 11/1994 | Fennell et al. .............. 340/636 |
| 5,764,034 A | * | 6/1998 | Bowman et al. . 320/DIG. 21 X |
| 5,814,973 A | * | 9/1998 | Liu ............................ 320/137 |
| 5,955,869 A | * | 9/1999 | Rathmann ................... 320/132 |

* cited by examiner

*Primary Examiner*—Edward H. Tso
(74) *Attorney, Agent, or Firm*—Jenkens & Gilchrist, P.C.

(57) ABSTRACT

An apparatus for monitoring the condition of a battery. The apparatus includes a battery clip that is used to secure a battery to a battery connection and a battery monitoring IC. The battery monitoring IC takes a "load vs. no-load measurement" and the results are recorded in a register. When the battery reaches a certain low voltage state, register bits are set and an output is generated. Furthermore, the exemplary embodiment includes a removal detection circuit for detecting removal and replacement of the battery and for preventing voltage floating on the battery output line.

5 Claims, 2 Drawing Sheets

BATTERY MONITORING SYSTEM WITH INTEGRATED BATTERY HOLDER

This application is a division of application Ser. No. 09/359,940, filed Jul. 22, 1999 now U.S. Pat. NO. 6,208,114.

BACKGROUND OF THE INVENTION

1. Field of the Invention

The present invention relates to battery monitoring circuitry and more particularly, but not by way of limitation, to a battery monitoring system that includes an integrated battery holder.

2. Background of the Problem and Related Art

It is well known that a primary battery is a convenient source of power for portable electric and electronic devices. Small size, ease of use, low maintenance and good shelf life are just a few of the reasons that primary batteries are frequently used in modern electronics. For example, primary batteries are regularly used in PCS and servers to keep a time of day clock running even when the particular device is not otherwise powered.

Because the primary battery is such a convenient and reliable source of power, many electronic devices also use the primary battery as a source of backup power, such as for CMOS memory—thereby preserving the contents of the memory even when the memory is not otherwise powered. In fact, the computer and electronic industry has incorporated the coin-shaped primary battery into the majority of devices that require a backup power source.

Because the primary battery often protects critical data from corruption and loss, a user cannot allow the battery to fail. The failure of a primary battery could mean disastrous data corruption, data loss and/or system downtime—all of which are unacceptable in today's information critical systems. Accordingly, it is vital that a user or system administrator be able to easily and accurately determine when a primary battery is nearing failure (but not yet completely depleted) and should be replaced.

Furthermore, it is vital that a primary battery be replaceable without corrupting the data it is backing up. In existing devices, replacing a primary cell allows voltage at the backed-up device to float. For example, FIG. 1 illustrates a block diagram of a battery backed, device 105 connected to a primary battery 110 through a supply voltage line 115 and a battery output line 120. The primary battery 110 is also grounded at ground 125. In this device, when the primary battery 110 is removed or inserted, the voltage on line battery output 120 momentarily changes, i.e., floats, and likely creates a condition in the battery backed device 105 that results in data corruption or other damage.

In light of the above-described and other deficiencies in the existing art, a device is needed that accurately monitors the characteristics of a battery, particularly the characteristics of a primary battery used in electronic systems. Furthermore, a device is needed that prevents the voltage on the primary battery's output line from floating when the battery is replaced.

SUMMARY OF THE INVENTION

To remedy the deficiencies of existing systems and methods, the present invention provides, among other things, an apparatus to accurately monitor the characteristics of a battery. Furthermore, the present device prevents the voltage on the primary battery's output line from floating when the battery is replaced.

In an exemplary embodiment, but by no means the only embodiment, the invention includes a battery clip that is used to secure a battery to a battery connection and a battery monitoring integrated circuit (IC). The battery monitoring IC takes a "load vs. no-load measurement" and the results are recorded in a register. When the battery reaches a certain low voltage state, register bits are set and a low battery signal is generated. Furthermore, the exemplary embodiment includes a removal detection circuit both for detecting removal and replacement of the battery and for preventing voltage float on the battery output line.

BRIEF DESCRIPTION OF THE DRAWINGS

Various objects and advantages and more complete understanding of the present invention will become apparent and more readily appreciated by reference to the following Detailed Description and to the appended claims when taken in conjunction with the accompanying Drawings wherein:

DETAILED DESCRIPTION

Figure 1:
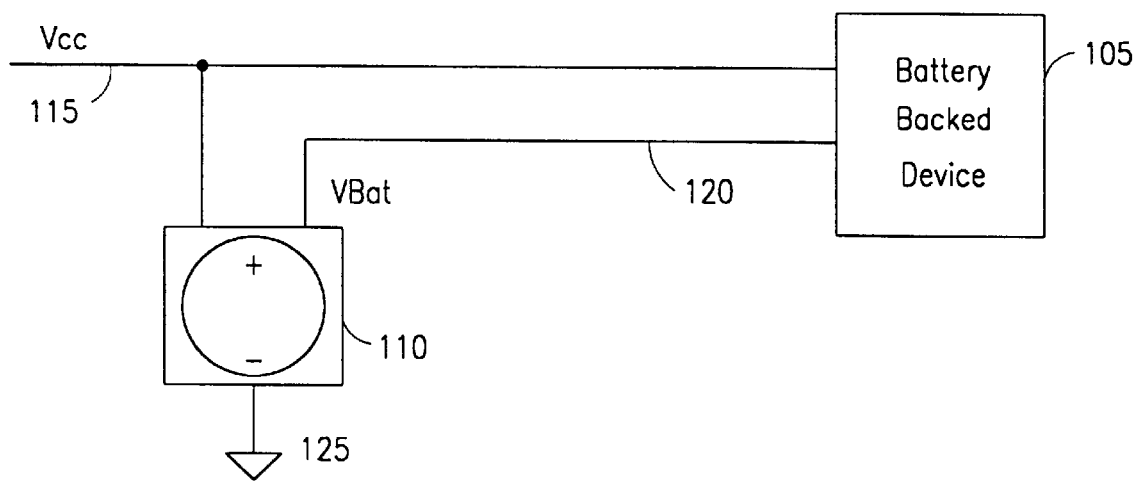
FIG. 1 is a block diagram of a battery backed device connected to a primary battery.

Although the present invention is open to various modifications and alternative constructions, a preferred exemplary embodiment that is shown in the drawings is described herein in detail. It is to be understood, however, that there is no intention to limit the invention to the particular forms disclosed. One skilled in the art can recognize that there are numerous modifications, equivalences and alternative constructions that fall within the spirit and scope of the invention as expressed in the claims.

Figure 2:
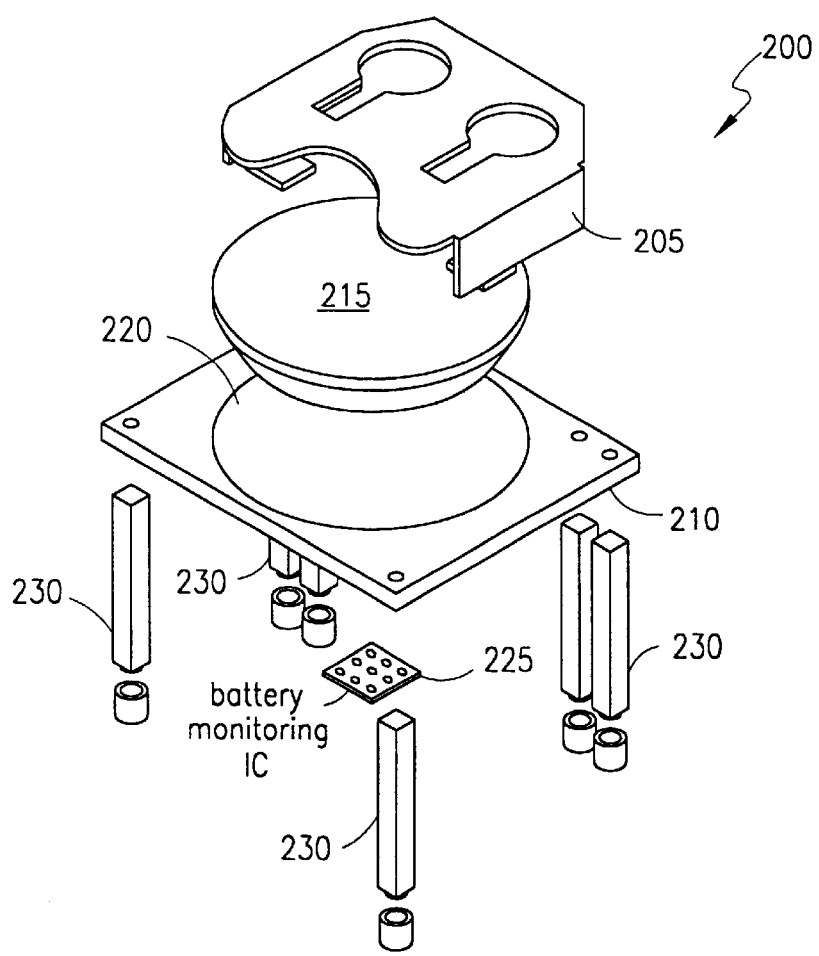
FIG. 2 is an exploded perspective of a battery holder including a battery monitoring integrated circuit (IC)

Referring now to FIG. 2, there is illustrated an exploded perspective of a battery holder 200 with a battery monitoring integrated circuit (IC) 225, which can be a microcontroller. In particular, there is illustrated a battery clip 205 that is attachable to a printed circuit board (PCB) 210. By attaching the battery clip 205 to the PCB 210, the battery 215 can be secured such that the cathode of the battery 215 is in contact with a metallic contact 220, such as a gold plated contact, located on the PCB 210. Additionally, pins 230 are also connected to the PCB 210.

In one embodiment, the battery clip 205 is constructed with nickel plated spring steel. In this embodiment, the battery clip 205 can be easily removed and attached to the PCB 210. Accordingly, the battery 215 can be easily replaced. Furthermore, the size of the battery clip 205 and the PCB 210 can be varied according to the diameter and thickness of any battery or type of battery—thereby minimizing the possibility of attaching the wrong type, size or diameter battery.

The PCB 210 and the battery clip 205 can form a discrete component that is not manufactured as a portion of a main system board, e.g., a motherboard. That is the PCB 210 and the battery clip 205 can be manufactured and sold separately from any system board. As can be appreciated, the discrete component including the PCB 210 and the battery clip 205 can be attached to a system board at any time.

Figure 3:
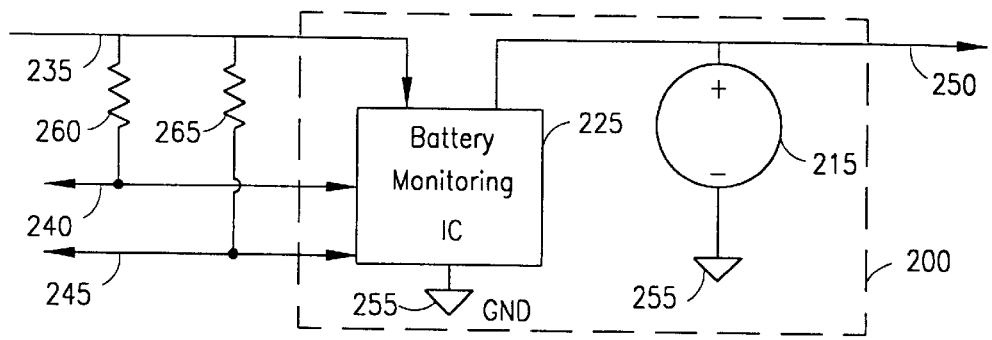
FIG. 3 is a block diagram of the electronics of the battery holder shown in FIG. 1.

Referring now to FIG. 3, there is illustrated a block diagram of the electronics of the battery holder 200 shown in FIG. 2. The battery monitoring IC 225, as shown in FIG. 3, is connected to five lines: a supply voltage line 235, a serial data line 240, a serial clock line 245, a battery output line 250, and a ground 255. These lines are generally connected to separate ones of pins 230 (shown in FIG. 2). The serial data line 240 and the serial clock line 245 form a 2-wire interface used to communicate with the battery monitoring IC 225. Furthermore, for control purposes, both the serial data line 240 and the serial clock line 245 are connected to the supply voltage line 235 by individual resistors 260 and 265.

In operation, the battery monitoring IC 225 operates by comparing the existing battery's condition against known battery characteristics. This is done while supply voltage is being applied to the battery monitoring IC 225 and while the battery is not loaded by the system. More particularly, the battery monitoring IC 225 performs a pair of voltage measurements on the battery output line 250. The first measurement is a voltage measurement taken when there is no load. The second measurement is also a voltage measurement. However, the second measurement is taken when there is a load. The difference between these two measurements is DELTA-V. The measurement DELTA-V, when taken over time, can be used to gauge the remaining useful capacity of the battery 215. Alternatively, a single DELTA-V measurement can indicate that the battery is nearing the end of its useful life.

Figure 4:
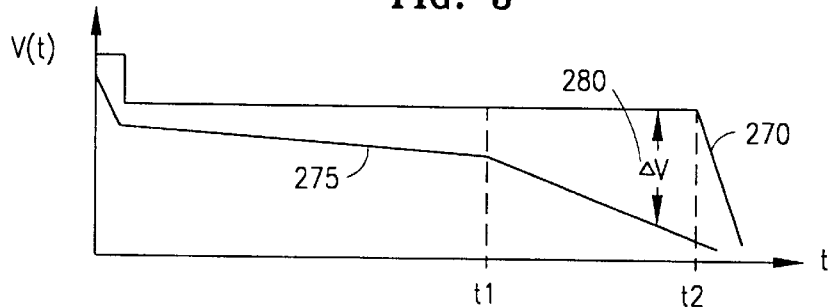
FIG. 4 is a "voltage vs. time" plot for a no-load voltage measurement and a loaded voltage measurement.

FIG. 4 illustrates a typical "voltage vs. time" plot for a no-load voltage measurement and a loaded voltage measurement. Measurement plot 270 represents an exemplary plot of the voltage for the no-load measurement and measurement plot 275 represents an example of the voltage plot for the loaded measurement. The difference between these two measurement plots at a particular time is represented by DELTA-V 280.

As illustrated by FIG. 4, the typical battery and its voltage output capacity continually degrade. By monitoring DELTA-V 280, a low battery can be identified before the battery is completely drained. As can be appreciated, the voltage from the no-load measurement 270 remains fairly constant until the battery is virtually depleted (time t2). The voltage from the loaded measurement 275, on the other hand, begins to fall rapidly near the end of the battery's life (after time t1) but well before the battery is depleted (time t2). Accordingly, DELTA-V grows substantially near the end of the battery's life (after time t1). The battery monitoring IC 225 can detect this growth in DELTA-V or detect when DELTA-V exceeds a certain threshold and notify a user that the battery 215 is nearing failure and should be replaced. Alternatively, battery monitoring IC 225 can provide the DELTA-V information to other circuitry that can notify the user of the battery's condition.

FIG. 4 represents only an exemplary plot of the "load vs. no-load" characteristics of a primary battery. Each type of battery, e.g., CR (lithium/manganese dioxide) and BR (lithium/carbon monofluoride), has its own characteristics that can be programmed into the battery monitoring IC 225. Thus, the battery monitoring IC 225 can be adapted to detect a low battery condition for any battery chemistry. Furthermore, the battery monitoring IC 225 can be programmed to detect a low battery condition for any particular battery capacity or other battery characteristic.

Figure 5:
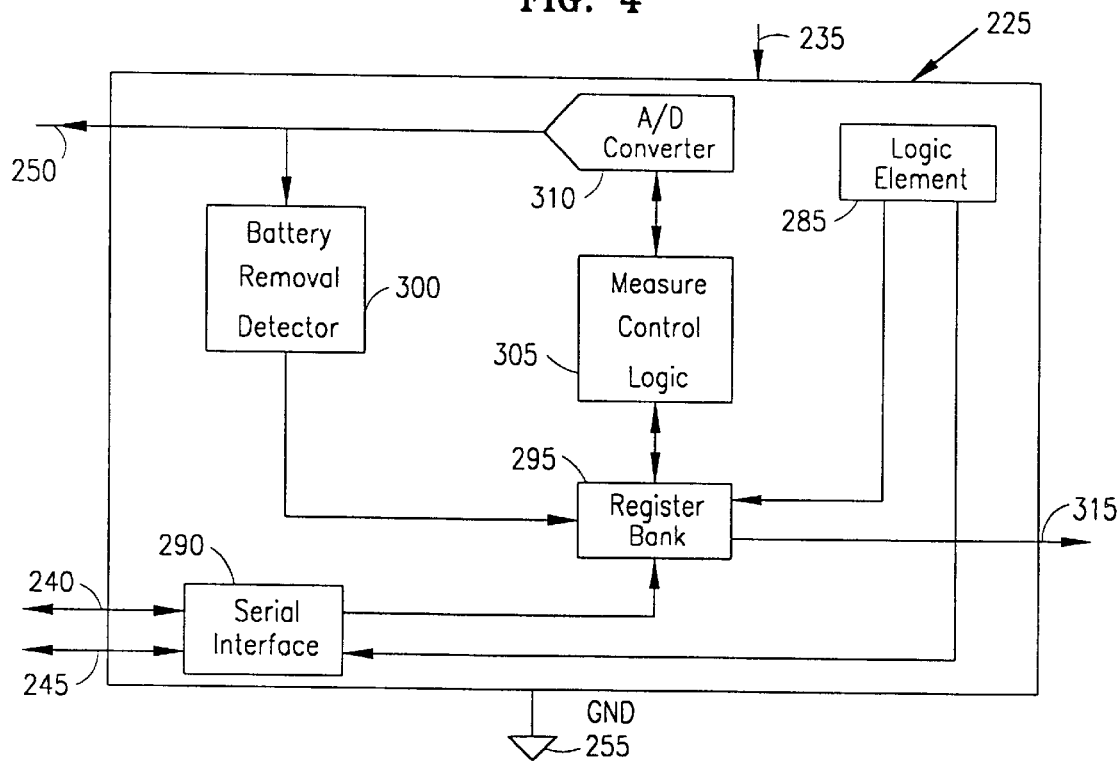
FIG. 5 is a more detailed block diagram of the battery monitoring IC shown in FIGS. 2 and 3.

Referring now to FIG. 5, there is illustrated a more detailed block diagram of the battery monitoring IC 225 shown in FIGS. 2 and 3. In this embodiment, the battery monitoring IC 225 includes a logic element 285 connected to both a serial interface 290 and a register bank 295, which includes a battery low output 315. The battery monitoring IC 225 also includes a battery removal detector 300 and a measure control logic 305, both of which are connected to the register bank 295. Furthermore, the measure control logic 305, which provides various logical capabilities, is connected to an analog-to-digital (A/D) converter 310.

Continuing to refer to FIG. 5, a DELTA-V measurement cycle is initiated whenever the supply voltage 235 is cycled or upon command from the host system (not shown) through the use of the register bank 295. As can be appreciated, for systems that are rarely powered down, the host system has the primary responsibility for initiating the DELTA-V measurement.

When a DELTA-V measurement cycle is initiated, the battery monitoring IC 225 measures the no-load battery voltage. Next, the battery monitoring IC 225 attaches a load to the battery for a select amount of time and takes a voltage measurement during that time. Although the size of the load and the length of time that the load is attached to the battery can vary, particularly good results have been obtained by attaching a 1.2MΩ load for one second. Because voltage measurements are generally analog, both measurements are converted to a digital format using the A/D converter 310. In one embodiment, the voltage measurement is an 8-bit successive approximation of the analog voltage measurement. One skilled in the art, however, can understand that other voltage measurement and/or data conversion schemes can be used to achieve similar results.

After both measurements have been taken and converted, the DELTA-V value is determined and stored in the register bank 295. This DELTA-V value is available over the 2-wire bus (lines 240 and 245 connected to the serial interface 290) to a host system (not shown) for particular battery monitoring options. Although particularly good results have been obtained by using the 2-wire bus, it is contemplated that other interfaces can be used instead of the 2-wire bus.

Next, when the DELTA-V sensing circuit 285 senses that the battery 215 is low, i.e., below a certain threshold, a battery status bit (not shown) in the register bank 295 is set to logic 0 and the battery low output 315 is driven to active low. Once set, the battery status bit remains logic 0 and the battery low output 315 remains asserted until the battery 215 is physically replaced.

The logic element also controls two additional bits in the register bank 295: a measurement status bit and a new measurement bit (neither of which are illustrated). The measurement status bit is set when a DELTA-V measurement cycle is in progress. The new measurement bit is set when a DELTA-V measurement cycle completes.

Continuing to refer to FIG. 5, the battery removal detector 300 can detect when the battery 215 (shown in FIGS. 2 and 3) is removed from or inserted into the battery holder 200 (also shown in FIGS. 2 and 3) and, responsive to detection of a battery 215 removal/insertion, set a no-battery bit in register bank 295. When the battery is replaced, the no-battery bit is flipped. Furthermore, when the battery is replaced, the new battery bit is set to logic 1. One advantage of the battery removal detector 300 is that it enables the battery 215 to be replaced while the system is "hot" or powered up.

Although the register bank 295 can be arranged in a variety of ways, particularly good results have been obtained when the register bank 295 includes a status register, a control register and a DELTA-V register (none of which are illustrated). The status register included in the register bank 295 provides information regarding the DELTA-V measurement process, the battery capacity state and battery replacement detection. Furthermore, the bits in the status register fall into two additional categories: those that are cleared after they are read and those are not affected by being read. For example, the new measurement bit and the new battery bit are cleared after they are read. The measurement status bit, the battery status bit and the no battery bit, on the other hand, are not affected by being read.

In an exemplary embodiment, the control register (not shown) included in the register bank 295 can be a write only register that is used to initiate a DELTA-V measurement cycle. In operation, a host system can write a logic 1 to this register and cause the logic element 285 to perform a DELTA-V measurement. The control register is particularly important for systems that are rarely powered down because the system can initiate a DELTA-V measurement cycle instead of waiting for the system to be powered down and back up.

The DELTA-V measurement register (not shown) included in the register bank 295 stores the results of the most recent DELTA-V measurement cycles. In one embodiment, the DELTA-V measurement register is a read only register that stores the last eight DELTA-V measurements. These stored DELTA-V measurements are accessible to the host system through the 2-wire bus (serial data line 240, serial clock line 245 and serial interface 290).

In conclusion, one skilled in the art can appreciate that the present invention provides an apparatus for monitoring the condition of a battery. In the exemplary embodiment, a battery clip is used to secure a battery to a battery connection and a battery monitoring IC. The battery monitoring IC takes a "load vs. no-load measurement" while Vcc is applied, and the results are recorded in a register. When the battery reaches a certain low voltage state, register bits are set and an output is generated. Furthermore, the exemplary embodiment includes a removal detection circuit for detecting removal and replacement of the battery and for preventing voltage float on the battery output line.

Those skilled in the art will readily recognize that numerous variations and substitutions may be made in the invention, its use and its configuration to achieve substantially the same results as achieved by the embodiments described herein. For example, bit configurations, logic values and component groupings can be easily altered. Accordingly, there is no intention to limit the invention to the disclosed exemplary forms. Many variations, modifications and alternative constructions will fall within the scope and spirit of the disclosed invention as expressed in the claims.

What is claimed is:

1. A battery monitoring circuit comprising:
   a measurement circuit element for performing a DELTA-V measurement;
   a storage device for storing the DELTA-V measurement; and
   an interface connected to the storage location, the DELTA-V measurement stored in the storage device being accessible through the interface; and
   a signal circuit element for signaling a low battery condition responsive to the DELTA-V measurement.

2. The battery monitoring circuit of claim 1 wherein an indicator of a low battery is stored in the storage device.

3. The battery monitoring circuit of claim 1, wherein the battery monitoring IC comprises:
   a battery removal detector for detecting removal of the battery.

4. The battery monitoring circuit of claim 3, wherein the battery removal detector limits voltage float on a battery output line.

5. The battery monitoring circuit of claim 1 further comprising:
   a primary cell coupled with the measurement circuit element.

* * * * *